US010007193B2

(12) United States Patent
Patra et al.

(10) Patent No.: US 10,007,193 B2
(45) Date of Patent: Jun. 26, 2018

(54) PROJECTION EXPOSURE APPARATUS AND METHOD FOR CONTROLLING A PROJECTION EXPOSURE APPARATUS

(71) Applicant: Carl Zeiss SMT GmbH, Oberkochen (DE)

(72) Inventors: Michael Patra, Oberkochen (DE); Markus Deguenther, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 514 days.

(21) Appl. No.: 14/556,765

(22) Filed: Dec. 1, 2014

(65) Prior Publication Data

US 2015/0085271 A1 Mar. 26, 2015

Related U.S. Application Data

(63) Continuation of application No. PCT/EP2013/001748, filed on Jun. 13, 2013.

(Continued)

(30) Foreign Application Priority Data

Jun. 15, 2012 (DE) ........................ 10 2012 210 071

(51) Int. Cl.

*G03B 27/54* (2006.01)
*G03F 7/20* (2006.01)

(52) U.S. Cl.

CPC ...... *G03F 7/70558* (2013.01); *G03F 7/70058* (2013.01); *G03F 7/7085* (2013.01); *G03F 7/70133* (2013.01)

(58) Field of Classification Search

CPC ........... G03F 7/70058; G03F 7/700066; G03F 7/70091; G03F 7/70125; G03F 7/70133;

(Continued)

(56) References Cited

U.S. PATENT DOCUMENTS 5,861,944 A * 1/1999 Nishi .................. G03F 7/70058 250/205
6,078,381 A * 6/2000 Suzuki ................ G03F 7/70066 355/53

(Continued)

FOREIGN PATENT DOCUMENTS

EP 0 950 924 A2 10/1999
WO WO 2010049020 A1 * 5/2010 ......... G03F 7/70141

OTHER PUBLICATIONS

International Search Report and Written Opinion for corresponding PCT Appl No. PCT/EP2013/001748, dated Nov. 8, 2013.

*Primary Examiner* — Christina Riddle
(74) *Attorney, Agent, or Firm* — Fish & Richardson P.C.

(57) ABSTRACT

A method is provided for controlling a projection exposure apparatus for microlithography, embodied as a scanner, in the exposure operation, in which a reticle is moved along a scanning axis with respect to a frame of the projection exposure apparatus such that the reticle is scanned by an illumination field radiated thereon, and the radiation of the illumination field is guided onto a wafer after interaction with the reticle in order to generate a desired dose distribution on the wafer. The method comprises the following steps: measuring positional changes of the illumination field in the direction of the scanning axis with respect to the frame of the projection exposure apparatus, and correcting the influence of a measured positional change of the illumination field on the dose distribution on the wafer by modifying at least one operational parameter of the projection exposure apparatus.

24 Claims, 5 Drawing Sheets

Related U.S. Application Data

(60) Provisional application No. 61/660,042, filed on Jun. 15, 2012.

(58) Field of Classification Search
CPC ............... G03F 7/70558; G03F 7/7085; G03F 7/70433; G03F 7/70775; G03F 7/70533; G03F 7/70525
USPC ............... 355/52, 53, 55, 67–71, 72, 75, 77; 250/492.1, 492.2, 492.22, 492.23, 493.1, 250/503.1, 504 R, 505.1
See application file for complete search history.

(56) References Cited

U.S. PATENT DOCUMENTS

| | | | | |
|---|---|---|---|---|
| 6,097,474 | A * | 8/2000 | McCullough | G03F 7/70066 355/69 |
| 6,331,885 | B1 * | 12/2001 | Nishi | G03F 7/70358 355/53 |
| 2002/0018189 | A1 | 2/2002 | Mulkens et al. | |
| 2002/0060296 | A1 | 5/2002 | Van Der Veen | |
| 2003/0054642 | A1 * | 3/2003 | Kagotani | G03F 7/70425 438/689 |
| 2005/0041226 | A1 * | 2/2005 | Tanaka | G03F 7/70241 355/53 |
| 2007/0018071 | A1 | 1/2007 | Kruijswijk et al. | |
| 2008/0212059 | A1 | 9/2008 | Warm et al. | |
| 2009/0262324 | A1 * | 10/2009 | Patra | G03F 7/7085 355/68 |
| 2011/0235015 | A1 | 9/2011 | Dengel et al. | |

* cited by examiner 10
12
14
16
18
20
22
24
26
28
30
32
34
36
38
40
42
42a
42b
42c
44
46
48
50
51
52
56
II
II'
x
y
z

PROJECTION EXPOSURE APPARATUS AND METHOD FOR CONTROLLING A PROJECTION EXPOSURE APPARATUS

CROSS-REFERENCE TO RELATED APPLICATIONS

The present application is a continuation of, and claims benefit under 35 USC 120 to, international application PCT/EP2013/001748, filed Jun. 13, 2013, which claims benefit under 35 USC 119 of German Patent Application No. 10 2012 210 071.7 filed on Jun. 15, 2012. International application PCT/EP2013/001748 also claims priority under 35 USC 119(e) to U.S. Provisional Application No. 61/660,042 filed on Jun. 15, 2012. The entire disclosure of international application PCT/EP2013/001748, German patent application 10 2012 210 071.7, and U.S. Provisional Application 61/660,042 are incorporated into the present application by reference.

BACKGROUND OF THE INVENTION

The invention relates to a method for controlling a projection exposure apparatus for microlithography, embodied as a scanner, in the exposure operation. Furthermore, the invention relates to a projection exposure apparatus for microlithography.

In the case of projection exposure apparatuses embodied as scanners, a reticle is moved along a scanning axis with respect to a frame of the projection exposure apparatus during the exposure operation such that the reticle is scanned by an illumination field radiated thereon. The scanned reticle surface is thereupon imaged on a wafer via a projection lens. As a result of such an exposure during the scanning operation, a desired dose distribution is generated on the wafer, which dose distribution emerges from the intensity distribution radiated onto the individual points of the wafer and integrated over the time of the exposure process.

However, there are often irregularities in the dose distribution radiated onto the wafer during the scanning operation. That is to say, the distribution of the dose accumulated by the wafer during a scanning process deviates from a desired intended distribution.

Underlying Object

It is an object of the invention to provide a method for controlling a projection exposure apparatus for microlithography and a projection exposure apparatus, via which the aforementioned problems are solved, and, in particular, irregularities in the dose distribution radiated onto the wafer can be kept as small as possible.

Solution According to the Invention

By way of example, according to the invention, the aforementioned object can be achieved by a method for controlling a projection exposure apparatus for microlithography, embodied as a scanner, in the exposure operation. In this exposure operation, a reticle is moved along a scanning axis with respect to a frame of the projection exposure apparatus such that the reticle is scanned by an illumination field radiated thereon, and the radiation of the illumination field is guided onto a wafer after interaction with the reticle in order to generate a desired dose distribution on the wafer. The method comprises the following steps: measuring positional changes of the illumination field in the direction of the scanning axis with respect to the frame of the projection exposure apparatus, and correcting the influence of a measured positional change of the illumination field on the dose distribution on the wafer by modifying at least one operational parameter of the projection exposure apparatus.

Here, the dose distribution on the wafer should be understood to mean a spatial distribution of the integrated intensity impinging on the wafer during the exposure operation, in which a scanning process is carried out. The integrated intensity should be understood to mean the intensity accumulated at a respective point of the wafer during the whole scanning process. This accumulated intensity is referred to as dose.

In other words, according to the method according to the invention, the position of the illumination field relative to the frame of the projection exposure apparatus is monitored in the direction of the scanning axis, i.e. in the scanning direction or opposite to the scanning direction. If a positional modification occurs, at least one operational parameter of the projection exposure apparatus is modified, to be precise in such a way that an effect on the dose distribution generated on the wafer during the exposure operation is corrected by modification of the operational parameter. Operational parameters which can be corrected can, for example, comprise the intensity of the radiation generating the illumination field and/or a scanning speed of the projection exposure apparatus, as explained in more detail below.

The solution according to the invention is based on the insight that a positional modification of the illumination field in the direction of the scanning axis can lead to the observed irregularities in the dose distribution radiated onto the wafer. The correction according to the invention leads to the situation where displacements in the illumination field, which occur during the exposure operation, do not lead, or only lead to a small extent, to irregularities in the dose distribution radiated onto the wafer.

As a result, the method can, for example, serve to correct an illumination instability of a radiation source of the projection exposure apparatus, leading to the illumination field, which is also referred to as illumination slit below, being displaced on the reticle in the direction of the scanning axis.

By way of example, such displacements occur in EUV illumination systems. In these systems, pupil facets are used to image field facets onto the reticle. If there is a change in the angular distribution of the light on the field facets, this leads to a modification in the reticle illumination. This angular distribution is primarily given by the spatial position of the source plasma of the EUV source. If the source plasma moves, this changes the angular distribution on the field facets, which in turn leads to a modification in the illuminated field position on the reticle. Such a modification of the illuminated field position can, in particular, lead to a positional change of the illumination field, which in turn leads to the dose errors on the wafer, as mentioned at the outset.

In accordance with one embodiment according to the invention, in order to correct the influence of the measured positional change of the illumination field on the dose distribution on the wafer, the emission intensity of the radiation generating the illumination field is modified. In particular, this is brought about by modifying the emission intensity of a radiation source which generates the radiation of the illumination field.

In accordance with one embodiment variant, in the case where the direction of the measured positional change of the illumination field corresponds to the movement direction of the reticle, the correction is brought about by reducing the intensity of the radiation generating the illumination field.

In accordance with a further embodiment according to the invention, in the exposure operation, the wafer furthermore carries out a scanning movement and, in order to correct the influence of the measured positional change of the illumination field on the dose distribution on the wafer, the speed of the scanning movement of the wafer is modified.

In accordance with one variant or embodiment, in the case where the direction of the measured positional change is opposite to the movement direction of the reticle, the correction is brought about by reducing the speed of the scanning movement of the wafer, and, in particular, by also reducing the speed of the scanning movement of the reticle.

In accordance with a further embodiment according to the invention, the positional changes of the illumination field are measured via a sensor module, which is configured for a spatially resolved intensity measurement.

In accordance with one variant of embodiment, the illumination field is generated by an illumination system of the projection exposure apparatus and the spatially resolving sensor module is arranged between the illumination system and the reticle. In other words, the spatially resolving sensor module is arranged in a region which lies between the last optical element of the illumination system and the reticle. In accordance with one embodiment, the measurement is arranged in the region of the reticle.

In accordance with a further embodiment, the spatially resolving sensor module has a detection region, which extends at least over the whole extent of the illumination field in the direction of the scanning axis.

In accordance with one variant of embodiment, the spatially resolving sensor module has sensor elements arranged in succession in the direction of the scanning axis, of which sensor elements two sensor elements are arranged in such a way that they respectively adjoin a respective peripheral region of the illumination field. Such sensor elements can be read out separately. The two sensor elements adjoining the peripheral region can, for example, either both be arranged within the illumination field or both be arranged outside of the illumination field. The specifications in respect of the arrangement of the sensor elements in relation to the illumination field or the peripheral region thereof relates to the situation in which the illumination field is in an intended position.

In accordance with a further embodiment according to the invention, the spatially resolving sensor module has at least three sensor elements arranged in succession in the direction of the scanning axis, wherein a central one of the sensor elements has a detection area, the extent of which is a multiple of the extent of the respective detection area of the other sensor elements. In accordance with one variant of embodiment, the detection area of the central sensor element extends over the whole extent of the illumination field in the direction of the scanning axis.

In accordance with a further embodiment according to the invention, the spatially resolving sensor module comprises a detection region and has a spatial resolution of at least 500 μm in at least one section of the detection region. In other words, the spatially resolving sensor module has at least one sensor element which can be read out separately, the detection area of which is less than or equal to 500 μm. In accordance with one variant or embodiment, the spatially resolving intensity sensor has at least five, in particular at least six, at least seven, at least ten or at least fifteen, sensor elements arranged in succession in the direction of the scanning axis.

In accordance with a further embodiment according to the invention, in the exposure operation, the reticle is moved backward and forward a number of times within a scanning region and the modification of the at least one operational parameter is undertaken within a period of time in which the reticle, after a positional change has taken place, is moved on by at most 10% of the length of the scanning region, in particular by at most 5% of the scanning length.

In accordance with a further embodiment according to the invention, the modification of the at least one operational parameter takes place within less than 10 milliseconds (ms), in particular within less than 8 ms, 5 ms, or 4 ms, after measuring the positional change.

Furthermore, according to the invention, provision is made for a projection exposure apparatus for microlithography, which comprises an illumination system for radiating an illumination field onto a reticle, a frame and a reticle displacement device which is configured for moving the reticle with respect to the frame along a scanning axis in such a way that the reticle is scanned by the illumination field. The projection exposure apparatus furthermore comprises a projection lens for generating a desired dose distribution on a wafer from the radiation of the illumination field after interaction with the reticle, a measuring device, which is configured to measure positional changes of the illumination field in the direction of the scanning axis with respect to the frame of the projection exposure apparatus, and a control device. The control device is configured to correct the influence of a measured positional change of the illumination field on the dose distribution on the wafer by modifying at least one operational parameter of the projection exposure apparatus.

Moreover, according to the invention, provision is made for a projection exposure apparatus for microlithography, which comprises an illumination system for radiating an illumination field onto a reticle and a reticle displacement device for moving the reticle backward and forward within a scanning region, wherein the reticle displacement device can be operated with a predetermined maximum scanning speed. Moreover, the projection exposure apparatus according to the invention comprises a control device, which is configured to convert a measurement signal relating to the radiated illumination field into a control signal for controlling an operational parameter of the projection exposure apparatus within a period of time during which the reticle displacement device is moved over at most 10% of the length of the scanning region, in particular over at most 5% of the length of the scanning region, at the maximum scanning speed. To this end, the control device contains correspondingly fast control electronics.

In accordance with one embodiment of the projection exposure apparatus, the control device is configured to convert the measurement signal into the control signal in less than 10 ms.

In accordance with a further embodiment, the projection exposure apparatus according to the invention is designed for exposure in the EUV wavelength range.

In accordance with a further embodiment according to the invention, the measuring device comprises a sensor module which is configured for the spatially resolved intensity measurement. In accordance with one variant of embodiment, the spatially resolving sensor module has a detection region, which extends at least over the whole extent of the illumination field in the direction of the scanning axis. In accordance with a further variant or embodiment, the spatially resolving sensor module has sensor elements arranged in succession in the direction of the scanning axis, of which sensor elements two sensor elements are arranged in such a way that they respectively adjoin a respective peripheral region of the illumination field. In accordance with a further variant or embodiment according to the invention, the spatially resolving sensor module has at least three sensor elements arranged in succession in the direction of the scanning axis, wherein a central one of the sensor elements has a detection area, the extent of which is a multiple of the extent of the respective detection area of the other sensor elements. In accordance with one embodiment according to the invention, the spatially resolving sensor module comprises a detection region and has a spatial resolution of at least 500 μm in at least one section of the detection region.

The features specified in respect of the embodiments, exemplary embodiments or embodiment variants of the method according to the invention, listed above, can be transferred accordingly to the projection exposure apparatus according to the invention in one of the specified variants. Conversely, the features specified in respect of the embodiments, exemplary embodiments or embodiment variants of the projection exposure apparatus according to the invention, listed above, can be transferred accordingly to the method according to the invention. These and other features of the embodiments according to the invention will be explained in the claims and in the description of the figures. The individual features can be realized either separately or in combination as embodiments of the invention. Furthermore, they can describe advantageous embodiments which are independently protectable and protection for which is claimed, if appropriate, only during or after pendency of the application.

BRIEF DESCRIPTION OF THE DRAWINGS

The above and further advantageous features of the invention are illustrated in the following detailed description of exemplary embodiments according to the invention with reference to the accompanying schematic drawings, in which.

DETAILED DESCRIPTION OF EXEMPLARY EMBODIMENTS ACCORDING TO THE INVENTION

In the exemplary embodiments or embodiments described below, elements which are functionally or structurally similar to one another are as far as possible provided with the same or similar reference signs. Therefore, for understanding the features of the individual elements of a specific exemplary embodiment, reference should be made to the description of other exemplary embodiments or the general description of the invention.

Figure 1:
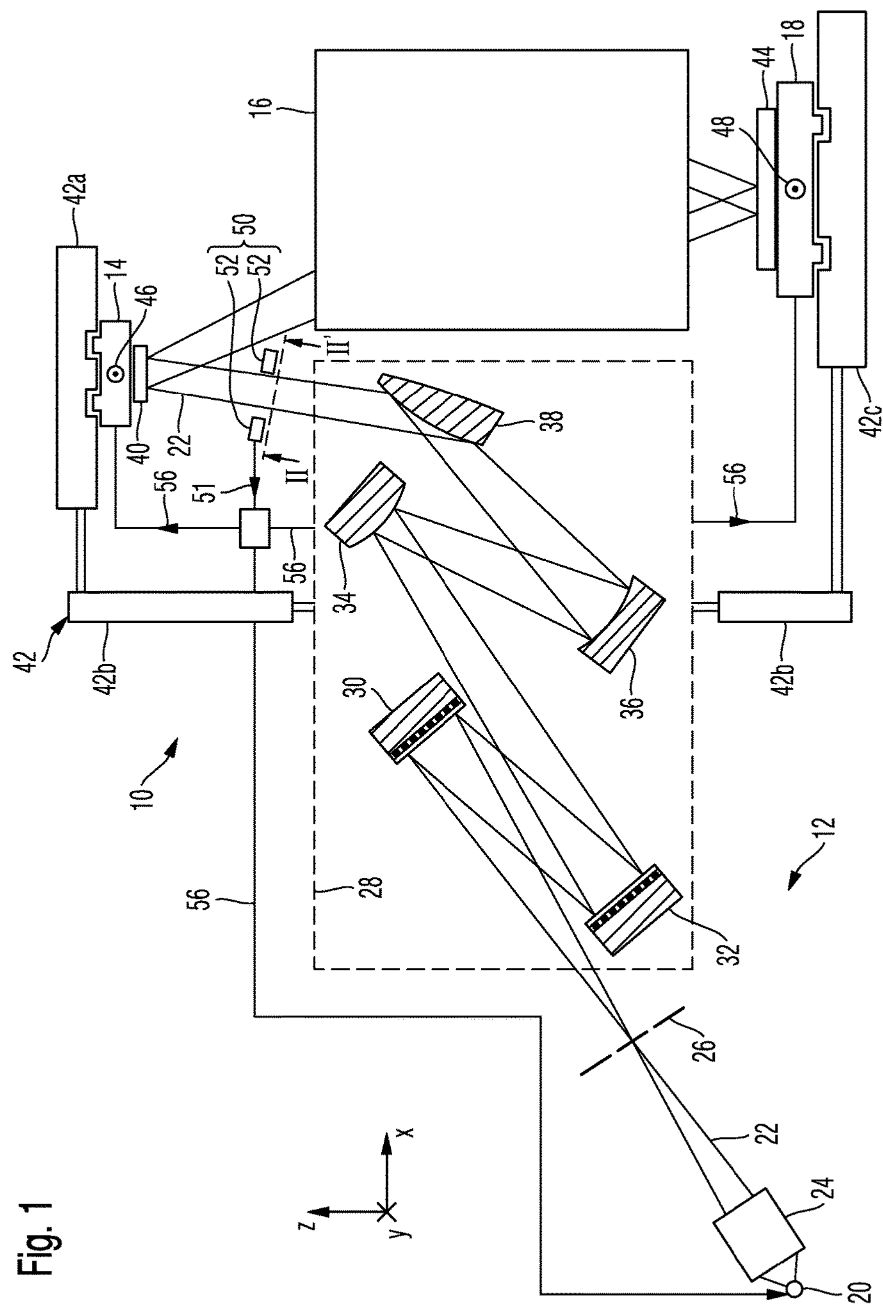
FIG. 1 shows a schematic sectional view of an embodiment of a projection exposure apparatus according to the invention, with a measuring device for measuring positional changes of an illumination slit radiated onto a reticle to be exposed.

To facilitate the description, a Cartesian xyz-coordinate system is indicated in the drawing, which system reveals the respective positional relationship of the components illustrated in the figures. In FIG. 1, the y-direction extends perpendicularly to the plane of the drawing and into the latter, the x-direction extends toward the right and the z-direction extends upward.

FIG. 1 schematically shows, in a meridional section, a projection exposure apparatus 10 for microlithography. The projection exposure apparatus 10 comprises an illumination system 12, a reticle displacement device 14, a projection lens 16 and a wafer displacement device 18. The illumination system 12 serves to radiate exposure radiation 22 onto a reticle 40, held by the reticle displacement device 14, during the exposure operation of the projection exposure apparatus 10. To this end, the illumination system 12 comprises a radiation source 20 for generating the exposure radiation 22. In the present case, the wavelength of the exposure radiation 22 lies in the EUV wavelength range, i.e. it has a wavelength of less than 100 nm, in particular 13.5 nm or 6.8 nm. Alternative embodiments of the projection exposure apparatus 10, which are operated at other exposure wavelengths, are feasible.

The exposure radiation 22, which is emitted by the radiation source 20, is initially collimated by a collector 24. The collector 24 is embodied as a nested collector mirror with a multiplicity of mirror shells, on which the exposure radiation 22 is reflected in a grazing manner. The individual shells of the collector 24 are held by spokes, which are arranged in the light path of the exposure radiation 22. Other embodiments of the collector 24 are also possible. After the collector 24, the exposure radiation 22 propagates through an intermediate focus plane 26, before it impinges on a first mirror 30 in the form of a field facet mirror. The field facet mirror has a multiplicity of field facets groups, which are arranged in columns and rows and are in turn respectively made up of a multiplicity of bent individual facets.

The exposure radiation 22 reflected by the first mirror 30 comprises a multiplicity of radiation partial beams, wherein each partial beam is reflected by a particular individual facet. Each partial beam in turn impinges on an individual facet, assigned to the partial beam, of a second mirror 22 in the form of a pupil facet mirror. Secondary light sources are generated at the location of the individual facets of the pupil facet mirror. The second mirror 32 is arranged in a plane of the illumination optical unit 28, which coincides with a pupil plane of the projection lens 16 or is optically conjugate thereto. Together, a third mirror 34, a fourth mirror 36 and a fifth mirror 38 form a transmission optical unit. With the aid thereof and with the aid of the second mirror 32, the field individual facets of the first mirror 30 are imaged on the reticle 40. A person skilled in the art knows of further details in respect of the design of the illumination optical unit 28 described above from US 2008/0212059 A1.

Figure 2:
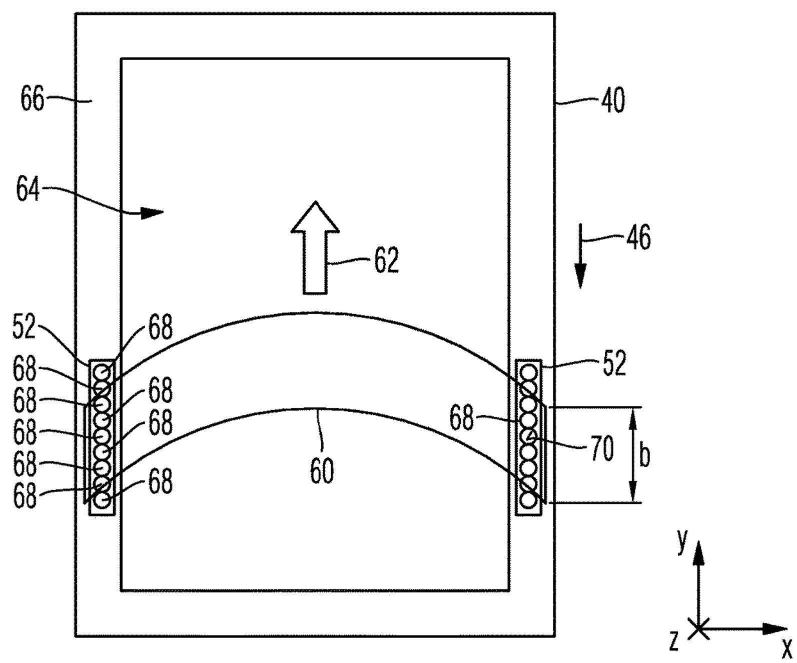
FIG. 2 shows a view along the line II-IF from FIG. 1 with a top view of the reticle from FIG. 1, a sectional view on the illumination slit radiated thereon and a view of the measuring device in a first embodiment according to the invention.

FIG. 2 shows a view of the reticle 40 along the line II-IF in FIG. 1, wherein the view onto the reticle 40 extends in the direction of the exposure radiation 22 radiated onto the reticle 40 by the illumination optical unit 28. As visualized in FIG. 2, the exposure radiation 22 is radiated onto the reticle 40 by the illumination system 12 in the form of an arched illumination slit 60. In the process, the illumination slit 60 forms an illumination field on the reticle 40, which moves over the surface of the reticle 40 during the exposure operation, i.e. scans the reticle 40, as will be described in more detail below.

As visualized in FIG. 1, the reticle 40 is held by the reticle displacement device 14, which was mentioned at the outset and is part of a reticle stage. The reticle displacement device 14 is formed by a displacement slide, which is mounted in a displaceable fashion along a scanning axis with respect to a frame 42*a* of the reticle stage. The wafer displacement device 18 is also embodied in the form of a displacement slide and is part of a wafer stage. The wafer displacement device 18 is, with respect to a frame 42*c* of the wafer stage, mounted in a displaceable fashion along the same scanning axis as the reticle displacement device 14.

The frame 42*a* of the reticle stage and the frame 42*c* of the wafer stage are respectively connected to a main frame 42*b* and together with the latter form a frame 42 of the projection exposure apparatus 10. The illumination system 28 is also connected to the frame 42. During the exposure operation, the reticle displacement device 14 and the wafer displacement device 18 are displaced synchronously. In the process, the reticle displacement device 14 is moved along a scanning direction 46, which corresponds to a scanning direction 48 of the wafer displacement device 18 and extends in the −y-direction of the coordinate system contained in the drawing. In the process, the illumination slit 60 sweeps over the whole surface to be exposed of the reticle 40. The radiation of the illumination slit 60 is reflected on the surface of the reticle 40 and directed onto the surface of the wafer 44 via the projection lens 16.

During a scanning process of the reticle 40, the illumination slit 60 is, as visualized in FIG. 2, scanned with respect to the reticle 40 in a slit movement direction 62 over the whole area to be imaged of the reticle 40, wherein the slit movement direction 62 is opposite to the scanning direction 46 of the reticle 40. In the process, the structures on the reticle surface are imaged on the wafer 44; thereafter the reticle displacement device 14 is returned in the direction opposite to the scanning direction 46 and the scanning process occurs again, wherein the wafer 44 is, to this end, arranged at a displaced position.

As visualized in FIG. 1, the projection exposure apparatus 10 furthermore comprises a measuring device 50, which is configured to measure positional changes of the illumination slit 60 with respect to the frame 42 in the direction of the scanning axis predetermined by the scanning direction 46. To this end, the measuring device 50 comprises two sensor modules 52 in the illustrated case, which modules are arranged between the last optical element of the illumination system 12, i.e. the fifth mirror 38, and the reticle 40.

The positional changes measured by the measuring device 50 are transmitted, in the form of a measurement signal 51, to a control device 54. The control device 54 converts the measurement signal 51 into control signals 56, which serve to correct the influence of the measured positional change of the illumination slit 60 on the dose distribution of the exposure radiation 22 on the wafer 44. This is brought about either by modifying the intensity of the exposure radiation 22 emitted by the radiation source 20 and/or by modifying the scanning speed of the wafer displacement device 18 and, in an analogous fashion thereto, the scanning speed of the reticle displacement device 14. The precise functionality of the corrections prompted by the control device 54 will be described in more detail below.

The sensor modules 52 of the measuring device 50 are displayed in FIG. 2 in a projection, together with the reticle 40. Furthermore, FIG. 2 shows an area on both the reticle 40 and the sensor modules 52, which area is covered by the illumination slit 60. The reticle 40 has a used region 64, which defines the region of the reticle 40 which is imaged on the wafer 44. The used region 64 is surrounded by a peripheral region 66 of the reticle 40. Although this region is, at least in part, still captured by the illumination slit 60 during the scanning process, it is not imaged on the wafer 44.

The sensor modules 52 are arranged on the peripheral region of the beam cross-section of the exposure radiation 22 radiated onto the reticle 40 in such a way that the projection of the sensor modules 52 falls into the peripheral region 66 of the reticle 40 or outside of same. The sensor modules 52 of the measuring device 50 are, like the illumination optical unit 28 as well, arranged rigidly with respect to the frame 42 of the projection exposure apparatus 10. In the ideal state, in which no instabilities occur, the position of the illumination slit 60 remains unchanged with respect to the sensor modules 52 during an exposure process.

As already mentioned above, the reticle 40 is displaced with respect to the frame 42 in the scanning direction 46 during such an exposure process. The illumination slit 60 remains fixed with respect to the frame 42, but it appears to be displaced with respect to the reticle 40 in the slit movement direction 62, which is opposite to the scanning direction 46. As a result of instabilities in the radiation source 20, caused, for example, by movement of the source plasma, the angular distribution of the exposure radiation 22 changes on the individual facets of the first mirror 30, which in turn leads to a modification of the position of the illumination slit 60 with respect to the sensor modules 52.

If such positional changes have components in the y-direction, i.e. along the scanning axis predetermined by the scanning direction 46, these components can be measured by the measuring device 50. To this end, the measuring modules 52 in the embodiment in accordance with FIG. 2 comprise a multiplicity of sensor elements 68 arranged successively in the y-direction. These sensor elements 68 respectively comprise circular detection areas 70, which have a diameter of e.g. 100 μm to 500 μm, depending on the sought-after measurement accuracy. The sensor elements 68 can each be read out separately and, in both directions, extend beyond the extent of the illumination slit 60 in the y-direction. If the position of the illumination slit 60 now changes along the y-coordinate axis, this change can be detected with great accuracy, in particular with a spatial resolution of approximately 100 μm to 500 μm, depending on the configuration, by reading out the intensity signals from the individual sensor elements 68.

Figure 3:
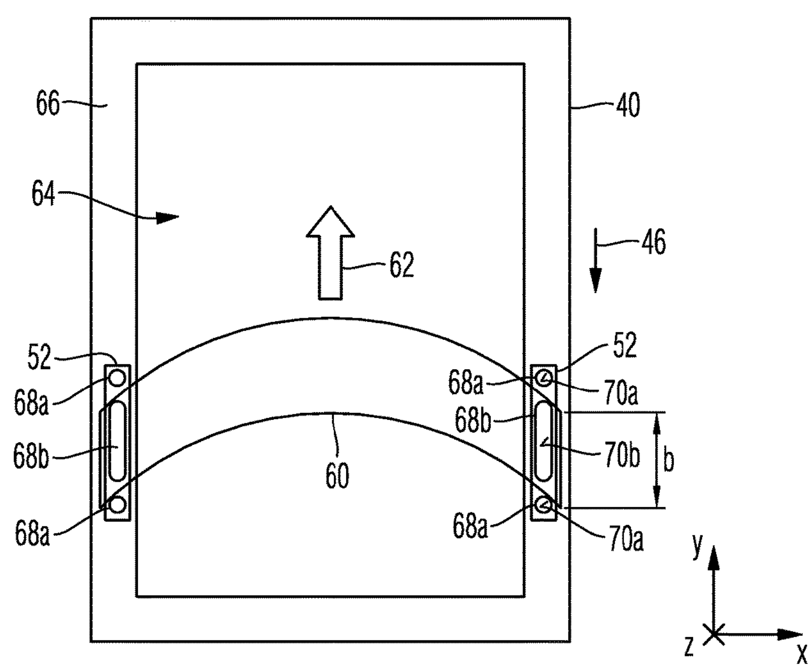
FIG. 3 shows the reticle of FIG. 2 with the measuring device in a further embodiment according to the invention.
Figure 4:
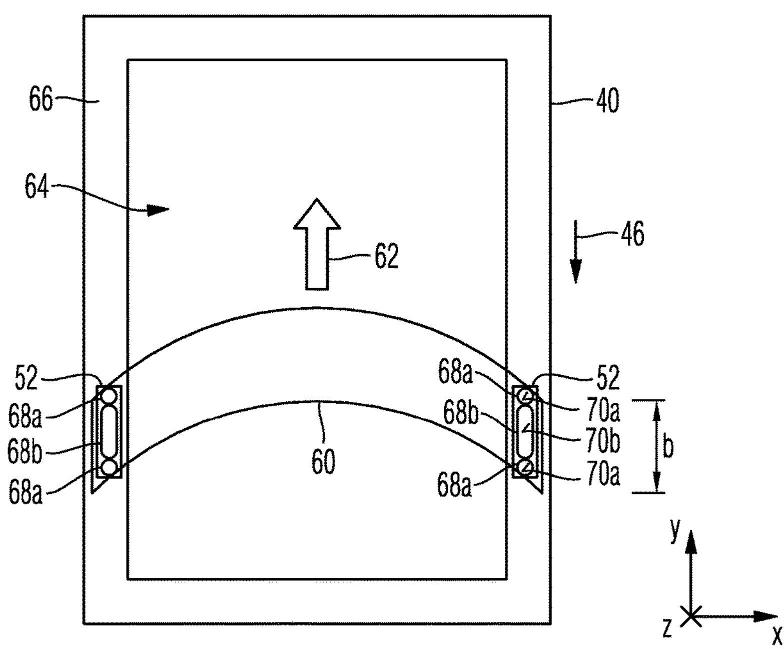
FIG. 4 shows the reticle from FIG. 2 or FIG. 3 with the measuring device in a further embodiment according to the invention.

FIGS. 3 and 4 show further embodiments of sensor modules 52 which can be used in the measuring device 50. These sensor modules 52 in each case have an elongate, central sensor element 68_b_ and circular sensor elements 68_a_, which directly adjoin the sensor element 68_b_ in the +y-direction and −y-direction. In terms of their design, the sensor elements 68_a_ correspond to the sensor elements 68 in accordance with FIG. 2 and have a circular detection area 70_a_ with a diameter of e.g. 100 μm to 500 μm.

In the embodiment in accordance with FIG. 3, the detection area 70_b_ of the central sensor element 68_b_, in an intended positional state, extends over the whole width b of the illumination slit 60, i.e. the whole extent of the illumination slit 60 in the y-direction. The sensor elements 68_a_ are arranged above and below the illumination slit 60. If the illumination slit 60 is displaced upward or downward in the y-direction, the corresponding sensor element 68_a_ registers an increased intensity. By contrast, the sensor element 68_b_ then partly protrudes out of the area of the illumination slit 60 and therefore registers a reduced intensity. The extent of the positional modification in the y-direction determines the extent of the intensity decrease on the central sensor element 68_b_. The accuracy of determining the positional change of the illumination slit 60 can therefore be better than the extent of the sensor element 68_b_.

In the embodiment in accordance with FIG. 4, a displacement of the illumination slit 60 in the direction of the y-coordinate axis leads to a loss in intensity in one of the two sensor elements 68_a_. Depending on the extent of the displacement, the intensity measured by the central sensor element 68_b_ reduces as well.

Figure 5:
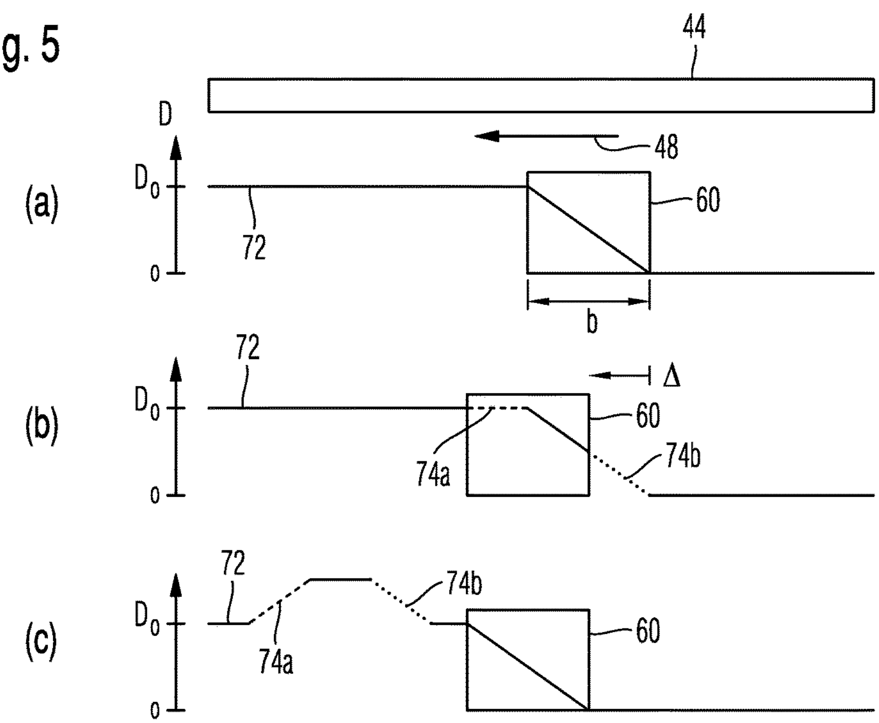
FIG. 5 shows a visualization of the intensity accumulated on a wafer at different times during a scanning process of the projection exposure apparatus, when a positional modification of the radiated illumination slit occurs with respect to a frame of the projection exposure apparatus.

FIG. 5 serves to visualize the intensity accumulated on the wafer 44 during a scanning process. The intensity accumulated at a point of the wafer at a specific time during the scanning process is referred to as dose D. In FIG. 5 (_a_), such a dose curve 72 along the y-coordinate axis is shown during a scanning process, in which the reticle 40 is imaged on a field of the wafer 44. The illumination slit 60 has the width b and is illustrated schematically as a rectangle in the figure. During the scanning process, the wafer 44 is moved in the scanning direction 48; in the drawing, the wafer 44 is moved from right to left. Hence, the illumination slit 60 moves from left to right with respect to the wafer 44, wherein the region of the wafer over which the illumination slit 60 has already completely swept over has accumulated a constant normal dose $D_0$.

In the interior of the illumination slit 60, a linear dose profile results on the wafer 44 as a result of the scanning movement. At the right edge of the illumination slit 60, at which a point on the wafer 44 just moves into the illumination slit 60, the dose is zero. At the left edge of the wafer 44, at which a point on the wafer 44 just reemerges from the illumination slit 60, the dose has reached the value $D_0$ required for the exposure. FIG. 5 (_b_) and (_c_) visualizes the effect on the dose curve 72 which occurs if, during the scanning process, the illumination slit 60 jumps by the value Δ in the direction of the y-coordinate axis, to be precise in the same direction as the scanning direction 48 of the wafer 44, with respect to the frame 42. The dose curve 72 at the time of the jump of the illumination slit 60 is shown in (b). At the time of the jump itself, the previously accumulated dose on the individual points of the wafer 44 is not yet modified.

For an improved visualization, two regions of the dose curve 72 have been marked especially: a so-called recaptured region 74_a_ of the dose curve 72 is illustrated in a dashed manner and a so-called released region 74_b_ is illustrated in a dotted fashion. The recaptured region 74_a_ had already reemerged from the illumination slit 60 prior to the jump, but it returns to the illumination slit 60 after the jump. The exact opposite condition holds for the released region 74_b_.

During the further course of the scanning process, the region 74_a_ accumulates a further dose. The left point of the region 74_a_ only obtains an infinitesimal amount of an additional dose since it immediately leaves the illumination slit 60 again. By contrast, the right point of the region 74_a_ still obtains a significant amount of dose, and so a linearly increasing dose profile emerges for the region 74_a_ after the scanning process. By contrast, the region 74_b_ once again completely passes through the whole illumination slit 60, and so each point on the wafer in the region 74_b_ once again obtains the whole nominal dose $D_0$. This dose is accumulated in addition to the dose which the region 74_b_ has already taken up. Thus, overall, a linearly decreasing dose profile emerges for the region 74_b_. The overall result is illustrated in FIG. 5 (_c_).

Figure 6:
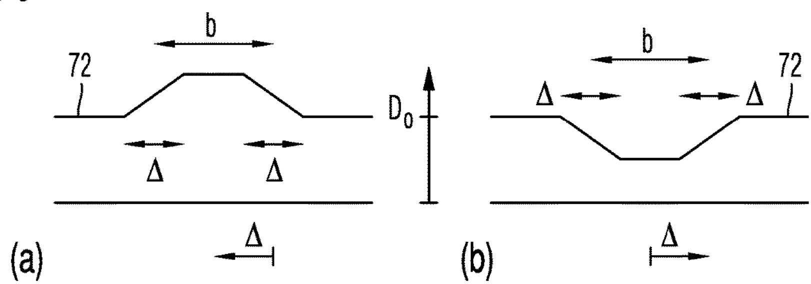
FIG. 6 shows an illustration of the accumulated intensity on a wafer after completing the scanning process for positional modifications of the illumination slit in different directions.

FIG. 6 (_a_) shows the final result of the dose curve 72 of the scanning process illustrated in FIG. 5, in which the illumination slit 60 jumps by Δ in the scanning direction 48 of the wafer 44 during the scanning process. In (b), the situation is illustrated in which such a jump takes place in the opposite direction, i.e. counter to the scanning direction of the wafer 48. A permanent jump therefore leads to a “bulge” or an “indent” in the dose profile across the exposed wafer 44. Whether the dose is increased, i.e. a “bulge” occurs, or whether it is reduced, i.e. an “indent” occurs, depends on whether the jump of the illumination slit 60 is in the scanning direction or opposite to the scanning direction.

As already mentioned above, the positional change of the illumination slit 60, for example in the form of a jump explained on the basis of FIGS. 5 and 6, is corrected during the scanning process, for example by a modification of the intensity of the exposure radiation 22 emitted by the radiation source 20. The influence of such an intensity modification will be explained on the basis of FIG. 7. Here, the intensity of the illumination slit 60 is reduced completely to zero during a scanning process, i.e. the illumination slit 60 is “switched off”.

Figure 7:
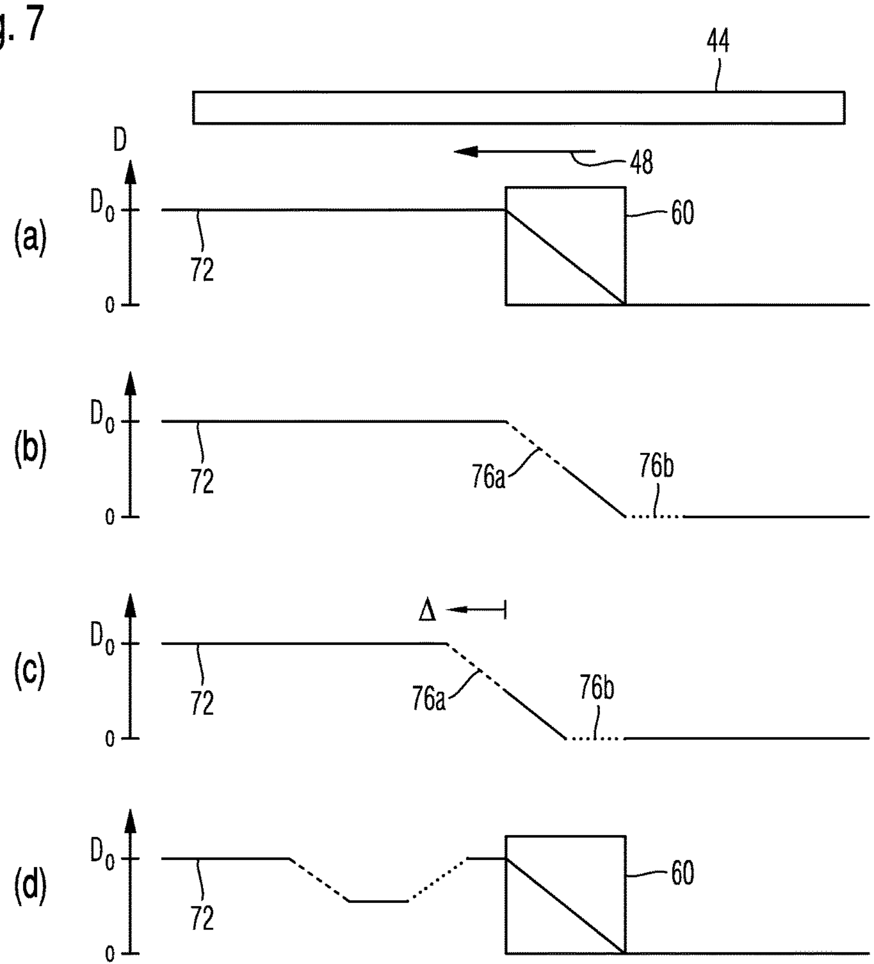
FIG. 7 shows a visualization of the intensity accumulated on a wafer at different times during a scanning process of the projection exposure apparatus, in the case of occasional switching off, according to the invention, of the illumination of the illumination slit during the scanning process.

FIG. 7 (_a_) illustrates the normal operational state and corresponds to the illustration in FIG. 5 (_a_). The illumination slit is switched off at the shown position of the illumination slit 60. This situation is illustrated in FIG. 7 (_b_). A so-called leaving region 76_a_ of the dose curve 72 is illustrated in a dashed fashion. This region comprises points on the wafer 44 which would have subsequently emerged from the illumination slit 60. A region 76_b_ is illustrated in a dotted fashion. This region contains points, which would have subsequently entered the illumination slit 60. The illumination slit 60 remains switched off for a period of time during which the wafer has moved on by the distance A, as illustrated in (c). Subsequently, the illumination slit 60 is switched on again, i.e. the intensity of the illumination is once again reset to the original value.

The leaving region 76_a_ has already completely left the illumination slit 60 when the illumination slit 60 is switched on again and can therefore accumulate no further dose. Thus, the region 76*a* has a linearly dropping off dose profile at the end of the scanning process. By contrast, the region 76*b* can still accumulate a further dose when the illumination slit has been switched on again, but only the right point of the region 76*b* has the whole width of the illumination slit 60 available, while the left point of the region 76*b* has a shorter length on which it can accumulate a dose. Therefore a linearly increasing dose profile emerges for the region 76*b*. The dose profile emerging after completing the scanning process is illustrated in FIG. 7 (*d*) and FIG. 8 (*b*).

Figure 8:
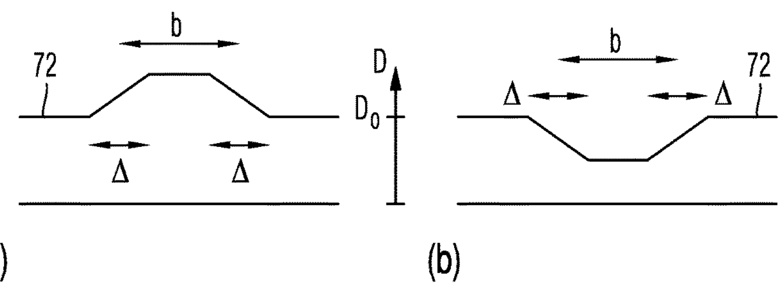
FIG. 8 shows an illustration of the intensity accumulated on the wafer after completing the scanning process, in the case of occasional switching-off of the illumination of the illumination slit or occasional doubling of the intensity of the illumination during the scanning process.

An analogous situation emerges if the intensity of the illumination slit 60 is not switched off, but rather doubled for a specific period of time Δ. The result for such doubling of the illumination intensity is illustrated in FIG. 8 (*a*). The time during which the illumination intensity is modified is converted into the distance Δ via the wafer displacement speed or the reticle displacement speed during the exposure process. If the effect on the dose 72 of an intensity modification of the exposure radiation 22 in accordance with FIG. 8 is compared with the effect of a jump of the illumination slit 60 in accordance with FIG. 6, it is possible to identify that these effects correspond to one another.

As an alternative to modifying the intensity of the radiated illumination slit 60, the dose profiles 72 on the wafer 44 can also be obtained by modifying the scanning speed of the reticle displacement device 14 and, analogously thereto, the wafer displacement device 18 during the exposure process. In particular, in order to generate the profile illustrated in FIG. 8 (*a*), it is advantageous to reduce, in particular halve, the scanning speed for a specific period of time instead of increasing the radiation power. As a result, the exposure operation in the normal state can be operated with maximum radiation intensity. As already described with reference to FIG. 1, the control device 54 generates control signals 56 on the basis of the positional profile of the illumination slit 60 measured during a scanning process, via which control signals the intensity of the radiation source 20 and/or the scanning speed of the reticle displacement device 14 and wafer displacement device 18 are modified as a correction measure.

Figure 9:
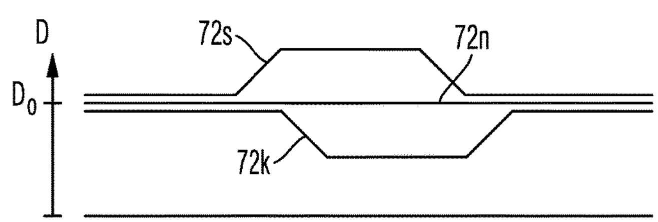
FIG. 9 shows an illustration of the effect of a positional modification of the illumination slit in conjunction with the effect of an occasional switching-off of the illumination, serving as a correction measure, on the integrated intensity on the wafer.

FIG. 9 visualizes a corresponding closed-loop control profile if a jump of the illumination slit 60 occurs in the scanning direction 48 of the wafer 44. The effect of such a jump on the dose profile of the wafer 44 is visualized by the dose curve 72*s*. It contains a "bulge" compared to a dose curve 72*n*, which describes the dose profile on the wafer 44 during normal operation, i.e. without the occurrence of a jump of the illumination slit 60. The jump occurring during a scanning process is registered by the measuring device 50 and transmitted to the control device 54 via the measurement signal 51. As already explained above, the control device 54 generates suitable control signals for correcting the disruption in the dose profile. Thus, the control device 54 comprises fast control electronics, which are configured to convert the input measurement signal 51 into one or more control signals 56 within a period of time during which the reticle displacement device 14 is moved in the y-direction over at most 10% of the length of the scanning region, i.e. the length of the used region 64 of the reticle, at the maximum scanning speed. The effect of the correction measures brought about by the control signals 56 is visualized in FIG. 9 by the dose curve 72*k*.

Figure 10:
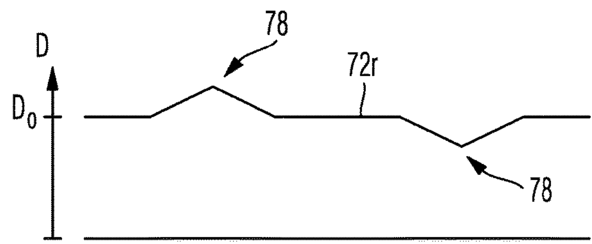
FIG. 10 shows an illustration of the dose curve resulting in accordance with FIG. 9 on the wafer when illuminating the scanning slit with an intensity profile having a rectangular form.
Figure 11:
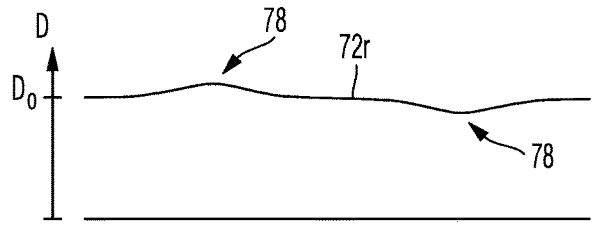
FIG. 11 shows the resultant dose curve from FIG. 10 when illuminating the scanning slit with a rounded-off intensity profile.

FIG. 10 shows a resultant dose curve 72*r*. It visualizes the resultant dose profile on the wafer 44, which emerges from the two dose curves 72*s* and 72*k* from FIG. 9. As a result of the time delay of the effect of a correction measure on the occurred jump of the illumination slit 60, the resultant dose curve 72*r* has remaining disruption remainders 78 in the form of a small indent or a small bulge. The dose curve in accordance with FIG. 10 emerges when the illumination in the illumination slit 60 in the scanning direction has an intensity profile with a rectangular shape. However, in reality, the edges of the illumination of the illumination slit 60 are washed out. It is for this reason that the disruption remainders 78 are much less pronounced in reality, as illustrated in the resultant dose curve 72*r* in accordance with FIG. 11.

The actual reaction time with which a reduction in the intensity of the radiation source 20 becomes effective after the occurrence of the jump of the illumination slit 60, can be slightly longer in the case of an embodiment of the radiation source 20 as a pulsed radiation source compared to the reaction time of the control device 54. When operating the radiation source 20 as an EUV radiation source, the repetition frequency of the radiation pulses is generally so high that the reaction time is lengthened by less than 1% of the width of the illumination slit 60.

LIST OF REFERENCE SIGNS

10 Projection exposure apparatus
12 Illumination system
14 Reticle displacement device
16 Projection lens
18 Wafer displacement device
20 Radiation source
22 Exposure radiation
24 Collector
26 Intermediate focus plane
28 Illumination optical unit
30 First mirror
32 Second mirror
34 Third mirror
36 Fourth mirror
38 Fifth mirror
40 Reticle
42 Frame
42*a* Reticle stage frame
42*b* Main frame
42*c* Wafer stage frame
44 Wafer
46 Scanning direction of the reticle displacement device
48 Scanning direction of the wafer displacement device
50 Measuring device
51 Measurement signal
52 Sensor module
54 Control device
56 Control signal
60 Illumination slit
62 Slit movement direction
64 Used region of the reticle
66 Peripheral region of the reticle
68 Sensor element
68*a* Sensor element
68*b* Sensor element
70 Detection area
70*a* Detection area
70*b* Detection area
72 Dose curve
72*n* Dose curve during normal operation
72*s* Dose curve during operation with an occurring disruption
72*k* Dose curve during operation with a correction measure
72*r* Resultant dose curve

74*a* Recaptured region
74*b* Released region of the dose curve
76*a* Leaving region of the dose curve
76*b* Entering region of the dose curve
78 Disruption remainder

The invention claimed is:

1. An apparatus, comprising:

an illumination system configured to radiate an illumination field on a reticle;

a displacement device configured to move the reticle with respect to a frame along a scanning axis during a scanning process so that the reticle is scanned by the illumination field;

a projection lens configured to generate a dose distribution on a wafer from the illumination of the illumination field after interaction with the reticle;

a measuring device configured to measure positional changes of the illumination field in the direction of the scanning axis with respect to the frame; and a control device configured to correct an influence of a measured positional change of the illumination field on the dose distribution on the wafer by: a) modifying at least one operational parameter of the apparatus from an original value for a period of time during the scanning process as a correction measure; and b) subsequently resetting the at least one operational parameter to its original value so that an effect of the correction measure on the dose distribution on the wafer after completion of the scanning process corresponds to an effect which the positional change of the illumination field has on the dose distribution on the wafer after completion of the scanning process, wherein the apparatus is a microlithography projection exposure apparatus.

2. The apparatus of claim 1, wherein the displacement device is configured to move the reticle within a scanning region, the displacement device has a maximum scanning speed, and the control device is configured to convert a measurement signal relating to the illuminated illumination field into a control signal to control the at least one operational parameter of the apparatus within a period of time during which the displacement device is moved over at most 10% of the length of the scanning region at the maximum scanning speed.

3. The apparatus of claim 2, wherein the control device is configured to convert the measurement signal into the control signal in less than 10 milliseconds.

4. The apparatus of claim 2, further comprising a projection lens configured to generate a dose distribution on the wafer from the illumination of the illumination field after interaction with the reticle.

5. The apparatus of claim 1, wherein the apparatus is an EUV microlithography projection exposure apparatus.

6. The apparatus of claim 1, wherein the at least one operational parameter is selected from the group consisting of an emission intensity of the radiation that generates the illumination field and a speed at which the wafer is scanned.

7. A method, comprising:

a) moving a reticle along a scanning axis so that: i) the reticle is scanned by an illumination field radiated thereon; and ii) the radiation of the illumination field is guided onto a wafer after interacting with the reticle to generate a dose distribution on the wafer;

b) during a), measuring positional changes of the illumination field in the direction of a scanning axis;

c) during a), modifying at least one operational parameter of the projection exposure apparatus from an original value for a period of time during the scanning process as a correction measure; and d) after c), resetting the at least one operational parameter to its original value so that an effect of the correction measure on the dose distribution on the wafer after completion of the scanning process corresponds to an effect which the positional change of the illumination field has on the dose distribution on the wafer after completion of the scanning process.

8. The method of claim 7, wherein the at least one operational parameter comprises modifying the emission intensity of the radiation that generates the illumination field.

9. The method of claim 8, wherein a direction of the measured positional change of the illumination field corresponds to the movement direction of the reticle, and c) comprises reducing the intensity of the radiation generating the illumination field.

10. The method of claim 7, wherein the at least one operational parameter comprises modifying the speed at which the wafer is scanned.

11. The method of claim 10, wherein, the direction of the measured positional change of the illumination field is opposite to the movement direction of the reticle, and c) comprises reducing the speed at which the wafer is scanned.

12. The method of claim 7, wherein b) comprises using a sensor module to achieve a spatially resolved intensity measurement.

13. The method of claim 12, wherein the illumination field is generated by an illumination system of the projection exposure apparatus, and the sensor module is between the illumination system and the reticle.

14. The method of claim 12, wherein the sensor module comprises a detection region extending over at least a whole extent of the illumination field in the direction of the scanning axis.

15. The method of claim 14, wherein the sensor module comprises sensor elements arranged in succession in the direction of the scanning axis, and two sensor elements are arranged so that they respectively adjoin a respective peripheral region of the illumination field.

16. The method of claim 12, wherein the sensor module comprises at least three sensor elements arranged in succession in the direction of the scanning axis, a central one of the at least three sensor elements comprises a detection area, and the detection area has an extent which is a multiple of the extent of the respective detection area of the other sensor elements.

17. The method of claim 12, wherein the sensor module comprises a detection region, and the sensor module has a spatial resolution of at least 500 micrometers in at least one section of the detection region.

18. The method of claim 7, comprising moving the reticle backward and forward a plurality of times within a scanning region, and c) is performed within a period of time in which the reticle is moved by at most 10% of a length of the scanning region.

19. The method of claim 7, wherein c) is performed within less than 10 milliseconds after b).

20. The method of claim 7, wherein a direction of the measured positional change of the illumination field corresponds to the movement direction of the reticle, and c) comprises reducing the intensity of the radiation generating the illumination field.

21. A method, comprising simultaneously:

moving a reticle along a scanning axis so that: i) the reticle is scanned by an illumination field radiated thereon; and ii) the radiation of the illumination field is guided onto a wafer after interacting with the reticle to generate a dose distribution on the wafer;

measuring positional changes of the illumination field in the direction of the scanning axis;

based on the measured positional changes of the illumination field in the direction of the scanning axis, modifying at least one parameter from an original value during the scanning process as a correction measure, the at least one parameter comprising: i) an emission intensity of a radiation source that generates the radiation that radiates the illumination field; and/or ii) a speed at which the wafer is scanned; and subsequently resetting the at least one operational parameter to its original value so that an effect of the correction measure on the dose distribution on the wafer after completion of the scanning of the reticle by the illumination field radiated thereon corresponds to an effect which the positional change of the illumination field has on the dose distribution on the wafer after completion of the scanning process.

22. The method of claim 21, wherein the method comprises, based on the measured positional changes of the illumination field in the direction of the scanning axis, modifying the emission intensity of the radiation source that generates the radiation that radiates the illumination field.

23. The method of claim 22, wherein the method comprises, based on the measured positional changes of the illumination field in the direction of the scanning axis, modifying the speed at which the wafer is scanned.

24. The method of claim 21, wherein the method comprises, based on the measured positional changes of the illumination field in the direction of the scanning axis, modifying the speed at which the wafer is scanned.

* * * * *